(12) United States Patent
Lee et al.

(10) Patent No.: US 9,444,057 B2
(45) Date of Patent: Sep. 13, 2016

(54) ORGANIC LIGHT-EMITTING DEVICE AND METHOD FOR MANUFACTURING SAME

(71) Applicant: LG DISPLAY CO., LTD., Seoul (KR)

(72) Inventors: Jung Hyoung Lee, Daejeon (KR); Minsoo Kang, Daejeon (KR); Ducksu Oh, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/360,168

(22) PCT Filed: May 31, 2013

(86) PCT No.: PCT/KR2013/004860
§ 371 (c)(1),
(2) Date: May 22, 2014

(87) PCT Pub. No.: WO2013/180545
PCT Pub. Date: Dec. 5, 2013

(65) Prior Publication Data
US 2014/0306214 A1   Oct. 16, 2014

(30) Foreign Application Priority Data

May 31, 2012   (KR) .................... 10-2012-0058923

(51) Int. Cl.
| | | |
|---|---|---|
| *H01L 51/00* | (2006.01) | |
| *H01L 51/52* | (2006.01) | |
| *H01L 51/50* | (2006.01) | |
| *H01L 51/56* | (2006.01) | |

(52) U.S. Cl.
CPC ....... *H01L 51/0072* (2013.01); *H01L 51/5056* (2013.01); *H01L 51/5072* (2013.01); *H01L 51/5088* (2013.01); *H01L 51/5092* (2013.01); *H01L 51/5228* (2013.01); *H01L 51/5268* (2013.01); *H01L 51/56* (2013.01); *H01L 2251/5392* (2013.01)

(58) Field of Classification Search
None
See application file for complete search history.

(56) References Cited

U.S. PATENT DOCUMENTS

| | | | |
|---|---|---|---|
| 7,217,965 B2 * | 5/2007 | Fujiki et al. .................. | 257/209 |
| 8,068,269 B2 | 11/2011 | Djordjev | |

(Continued)

FOREIGN PATENT DOCUMENTS

| | | |
|---|---|---|
| CN | 1897296 A | 1/2007 |
| CN | 101606250 A | 12/2009 |

(Continued)

OTHER PUBLICATIONS

Office Action of Korean Patent Office in Appl'n No. 10-2013-0063130, dated Jul. 28, 2015.

(Continued)

*Primary Examiner* — Yasser A Abdelaziez
(74) *Attorney, Agent, or Firm* — Dentons US LLP

(57) ABSTRACT

The present invention relates to an organic light emitting device and a method for preparing the same, and the organic light emitting device according to the present invention comprises: a substrate; a first electrode provided on the substrate; an organic material layer provided on the first electrode; a second electrode pattern provided on the organic material layer and comprising two or more metal layers spaced apart from each other; and a fuse layer provided in an entire region of an upper surface of the second electrode pattern and gaps between the metal layers spaced apart from each other.

22 Claims, 3 Drawing Sheets

(56) References Cited

U.S. PATENT DOCUMENTS

| | | |
|---|---|---|
| 2003/0010985 A1 | 1/2003 | Shen |
| 2004/0164294 A1 | 8/2004 | Son et al. |
| 2005/0174064 A1 | 8/2005 | Agostinelli et al. |
| 2007/0236142 A1 | 10/2007 | You |
| 2010/0140598 A1* | 6/2010 | Paravia ............... H01L 27/3202 257/40 |
| 2011/0068688 A1 | 3/2011 | Choi et al. |
| 2011/0101314 A1 | 5/2011 | Kim |
| 2012/0007071 A1 | 1/2012 | Joo et al. |
| 2013/0187186 A1 | 7/2013 | Popp |

FOREIGN PATENT DOCUMENTS

| | | |
|---|---|---|
| CN | 102414295 A | 4/2012 |
| EP | 1003229 A1 | 5/2000 |
| EP | 2398086 A1 | 12/2011 |
| JP | 2007-207569 A | 8/2007 |
| KR | 20060042013 A | 5/2006 |
| KR | 20090118976 A | 11/2009 |
| KR | 10-2010-0123718 A | 11/2010 |
| KR | 10-1065409 B1 | 9/2011 |
| KR | 10-1084266 B1 | 11/2011 |
| TW | 200903797 A | 1/2009 |
| WO | 2008-099315 A2 | 8/2008 |

OTHER PUBLICATIONS

Office Action of Taiwanese Patent Office in Appl'n No. 102119500, dated Oct. 22, 2015.

* cited by examiner 30   40

ORGANIC LIGHT-EMITTING DEVICE AND METHOD FOR MANUFACTURING SAME

This application is a National Stage Application of International Application No. PCT/KR2013/004860, filed May 31, 2013, and claims priority to and the benefit of Korean Application No. 10-2012-0058923, filed on May 31, 2012, the disclosures of which are incorporated by reference herein in their entirety.

TECHNICAL FIELD

The present invention relates to an organic light emitting device and a method for preparing the same.

This application claims priority from Korean Patent Application No. 10-2012-0058923 filed on May 31, 2012, at the KIPO, the disclosure of which is incorporated herein by reference in its entirety.

BACKGROUND ART

An organic light emitting device is composed of two opposing electrodes and multilayered organic material thin films having semiconductor-like properties which are interposed therebetween. The organic light emitting device having the configuration uses a phenomenon in which electric energy is converted into light energy by using an organic material, that is, an organic light emitting phenomenon. Specifically, when voltage is applied between two electrodes in a structure in which an organic material layer is disposed between an anode and a cathode, holes from the anode and electrons from the cathode are injected into the organic material layer. When the injected holes and electrons meet each other, an exciton is formed, and the exciton falls down to a bottom state to emit light.

In the aforementioned organic light emitting device, light generated from the organic material layer is emitted through a light transmissive electrode, and the organic light emitting device may be typically classified into a top emission type, a bottom emission type, and a dual emission type. In the case of the top emission or bottom emission type, one of two electrodes needs to be a light transmissive electrode, and in the case of the dual emission type, both the two electrodes need to be a light transmissive electrode.

In respect to the aforementioned organic light emitting device, many studies have been concentrated since Kodak Co., Ltd., announced that when a multilayer structure is used, the device may be driven at a low voltage, and recently, a natural color display using the organic light emitting device is attached to a mobile phone and commercialized.

Further, as recent studies on the organic light emitting device using a phosphorescent material instead of an existing fluorescent material have been conducted, efficiency has rapidly improved, and it is also expected that the device would be able to replace an existing illumination in the near future.

In order to use the organic light emitting device as illumination, the device needs to be driven with high brightness unlike the existing natural color display, and to maintain constant brightness like the existing illumination. In order to sufficiently improve the brightness of the organic light emitting device, light emission needs to be implemented in a large area, and in order to implement light emission in the large area, a high driving current needs to be used. In addition, in order to maintain constant brightness in the large area, the aforementioned high current needs to be uniformly injected into the device having the large area.

In general, as an anode material of the organic light emitting device, a metal oxide having a large work function is usually used. However, electrical conductivity of the metal oxide is not relatively high. Therefore, when such a metal oxide is used in an organic EL or an LCD having a small display area, there is no problem, but when the metal oxide is used in a large area organic EL for use in illumination equipment, a voltage drop due to high current is so high that the current is not uniformly injected into a light emitting surface, and thus light emission of the device does not uniformly occur. For example, light is emitted only in the vicinity of a portion in which an electrode is electrically connected to a driving circuit, and weak light emission may occur or light emission may not occur in the other regions.

Meanwhile, as a cathode material of the organic light emitting device, a metal having a small work function or an alloy thereof is usually used. The aforementioned metal may have high electrical conductivity of the material itself, but when transparency of the electrode is required as a characteristic of the organic material device, electrical conductivity is reduced if the metal is formed as a thin film. Therefore, even in this case, since current is not uniformly injected into a light emitting surface, light emission of the device may not uniformly occur.

Therefore, in order to use an organic light emitting device as illumination equipment, it is necessary to allow light emission with high brightness to uniformly occur in a device having a large area by reducing a resistance of an electrode.

DETAILED DESCRIPTION OF THE INVENTION

Technical Problem

The present invention has been made in an effort to provide an organic light emitting device having a large area which may automatically block excessive current with a predetermined value or more from continuously flowing when an electric short occurs in a part of a light emitting region, by comprising a fuse in the organic light emitting device.

Technical Solution

The present invention provides an organic light emitting device comprising:
a substrate;
a first electrode provided on the substrate;
an organic material layer provided on the first electrode;
a second electrode pattern provided on the organic material layer and comprising two or more metal layers spaced apart from each other; and
a fuse layer provided in an entire region of an upper surface of the second electrode pattern and gaps between the metal layers spaced apart from each other.

Further, the present invention provides an organic light emitting device comprising:
a substrate;
a first electrode provided on the substrate;
an organic material layer provided on the first electrode; and
a second electrode provided on the organic material layer,
in which thicknesses of at least some regions of the second electrode are different from those of the other regions thereof.

In addition, the present invention provides an organic light emitting device comprising:
a substrate;
a first electrode provided on the substrate;
an organic material layer provided on the first electrode;
a second electrode pattern provided on the organic material layer and comprising a compound represented by the following Formula 1; and
a fuse layer provided in an entire region of an upper surface of the second electrode pattern and gaps between the second electrode patterns.

[Formula 1]

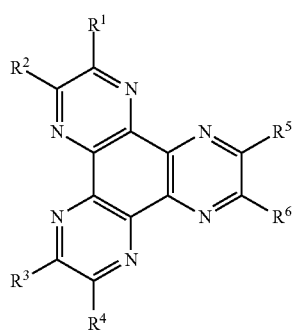

In Formula 1,
$R^1$ to $R^6$ are the same as or different from each other, and each independently hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), a substituted or unsubstituted straight or branched $C_1$ to $C_{12}$ alkoxy, a substituted or unsubstituted straight or branched $C_1$ to $C_{12}$ alkyl, a substituted or unsubstituted straight or branched $C_2$ to $C_{12}$ alkenyl substituted or unsubstituted aromatic or non-aromatic heterocyclic ring, a substituted or unsubstituted aryl, a substituted or unsubstituted mono- or di-aryl amine, or a substituted or unsubstituted aralkyl amine, in which R and R' are each independently a substituted or unsubstituted $C_1$ to $C_{60}$ alkyl, a substituted or unsubstituted aryl, or a substituted or unsubstituted 5- to 7-membered heterocyclic ring.

Furthermore, the present invention provides a display apparatus comprising the organic light emitting device.

Further, the present invention provides an illumination apparatus comprising the organic light emitting device.

In addition, the present invention provides a method for preparing an organic light emitting device, the method comprising:
1) forming a first electrode on a substrate;
2) forming an organic material layer on the first electrode;
3) forming two or more metal layers spaced apart from each other on the organic material layer; and
4) forming a fuse layer in an entire region of an upper surface of the metal layer and gaps between the metal layers spaced apart from each other.

Advantageous Effects

The organic light emitting device according to the present invention comprises a fuse layer on a second electrode such that when excessive current is generated at a specific organic light emitting unit, a portion, in which the second electrode and the fuse layer are in contact with each other, is automatically disconnected, thereby preventing the entire organic light emitting device from being electrically short-circuited.

EXPLANATION OF REFERENCE NUMERALS AND SYMBOLS

Figure 1:
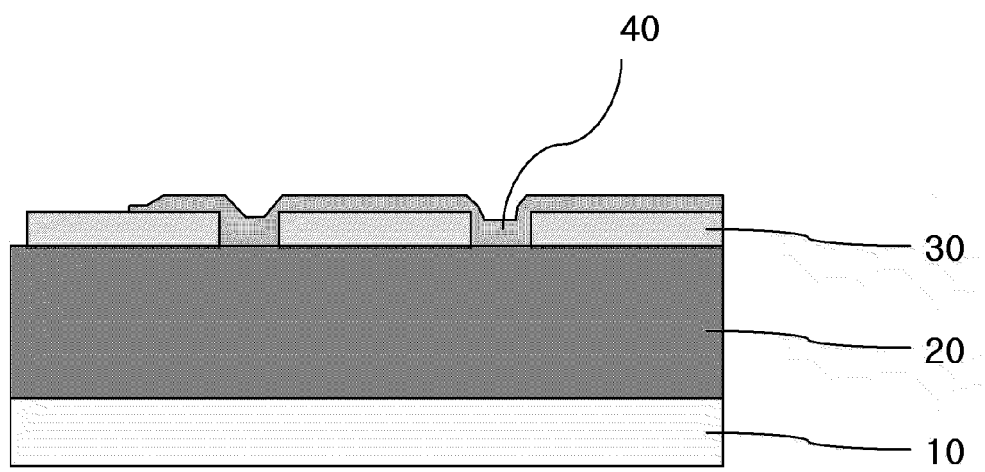
FIG. 1 is a vertical sectional view schematically illustrating an organic light emitting device comprising a fuse layer as an exemplary embodiment of the present invention.

10: First electrode (which may further include an auxiliary electrode)
20: Organic material layer
30: Second electrode pattern
40: Fuse layer

BEST MODE

Hereinafter, the present invention will be described in detail.

In general, an organic light emitting device has a structure in which two electrodes having a large area face each other, and an organic material layer, which emits light by current, is formed therebetween. The current is applied at an edge of the electrode, flows toward the center of the electrode, passes through an organic material, and is discharged to the other electrode facing the electrode. At this time, a voltage drop occurs in proportion to a resistance of the electrode while the current flows toward the center of the electrode from the edge thereof. Since energy is consumed as much as the voltage drop occurs due to the resistance of the electrode, energy efficiency of the organic light emitting device is reduced.

Furthermore, since an electric field formed between the two electrodes varies, a light emitting amount of the organic material varies depending on a position of the electrode, and a difference in brightness depending on the position is not good in terms of appearance, and adversely affects stability of the device. Therefore, in the organic light emitting device, a design for minimizing these problems is needed.

A transparent electrode used in the organic light emitting device is transparent such that light may be transmitted, but has very high electrical resistance compared to a metal electrode. Therefore, when the organic light emitting device is intended to be implemented in a large area, the voltage distribution within the large light emission area is not uniform due to the high electrical resistance of the transparent electrode, and accordingly, there is a problem in obtaining light emission with uniform brightness in a large area. A method generally used in order to solve the problem is to install an auxiliary electrode using a metal on or under the transparent electrode. A metal auxiliary electrode is manufactured with a lattice shape as thin as possible in order to secure transparency, and a method of increasing the cycle of the lattice as long as possible is used in order to increase transparency while obtaining a uniform voltage distribution in a large area. However, the method of using a metal auxiliary electrode with a lattice shape has not only a problem in that complexity of the process increases, but also a process problem in that when an auxiliary electrode is formed on a transparent electrode, it is to uniformly stack an organic material to be configured on the auxiliary electrode due to the height thereof.

Further, in an organic light emitting device having a large area, which comprises a plurality of organic light emitting pixels, there is a problem in that when excessive current flows into a part of the organic light emitting pixels among the plurality of organic light emitting pixels, and as a result, a defect such as an electric short occurs, defects occur in the entire organic light emitting device having a large area.

Thus, the present invention has been made in an effort to provide an organic light emitting device having a large area which may automatically block excessive current with a predetermined value or more from continuously flowing when an electric short occurs in a part of a light emitting region, by comprising a fuse in the organic light emitting device.

An organic light emitting device according to an exemplary embodiment of the present invention comprises: a substrate; a first electrode provided on the substrate; an organic material layer provided on the first electrode; a second electrode pattern provided on the organic material layer and comprising two or more metal layers spaced apart from each other; and a fuse layer provided in an entire region of an upper surface of the second electrode pattern and gaps between the metal layers spaced apart from each other.

In the organic light emitting device according to the present invention, the metal layer may comprise one or more of Al, Ag, Ca, Mg, Au, Mo, Ir, Cr, Ti, Pd, and an alloy thereof, but is not limited thereto.

In the organic light emitting device according to the present invention, a gap between the metal layers of the second electrode pattern may be from 10 μm to 300 μm, but is not limited thereto.

In the organic light emitting device according to the present invention, the fuse layer may be formed using a metal having a melting point lower than that of the metal layer. In addition, the fuse layer may comprise the same material as that of the metal layer.

More specifically, the fuse layer may comprise one or more of Al, Ca, Mg, Ag, indium (In), and the like, but is not limited thereto.

Furthermore, when the fuse layer comprises the same material as that of the metal layer, the organic light emitting device may be designed such that the fuse layer is formed to be thinner than the metal layer, and the fuse layer portion is short-circuit when excessive current occurs.

The fuse layer may be formed in the form of covering a metal layer of the second electrode pattern by using a shadow mask and through a deposition process. The thickness of the fuse layer may be from 10 nm to 100 μm, but is not limited thereto.

The difference in thickness between the metal layer of the second electrode pattern and the fuse layer may be from 10 nm to 100 nm. When the difference in thickness is less than 10 nm, electrical connection between the second electrode patterns may be unstable.

It is preferred that the metal layer comprises Al, and the fuse layer comprises one or more selected from the group consisting of Al, Ag, Ca, Mg, and indium (In), but the present invention is not limited thereto.

In the organic light emitting device according to the present invention, it is preferred that the metal layer of the second electrode pattern comprises Ag, and the fuse layer comprises Ca, but the present invention is not limited thereto.

At least a part of the fuse layer may be a form having a structure that is in contact with the organic material layer. That is, at least a part of the fuse layer provided in a region between the metal layers spaced apart from each other may have a structure that is in contact with the organic material layer.

Further, the surface shape of the fuse layer may comprise not only a plane form, but also a form such as a curved surface and unevenness. The fuse layer is provided in an entire region of an upper surface of the patterned second electrode and gaps between the metal layers spaced apart from each other, and serves to electrically connect the patterned second electrode.

In addition, at least a part of the fuse layer may comprise a structure having a form which is electrically short-circuited. That is, in the present invention, even when a defect occurs due to an occurrence of a short in a part of the organic light emitting unit in the organic light emitting device having a large area, the other organic light emitting units, except for the organic light emitting unit in which the defect occurs, may be normally operated.

In addition, an organic light emitting device according to another exemplary embodiment of the present invention comprises: a substrate; a first electrode provided on the substrate; an organic material layer provided on the first electrode; and a second electrode provided on the organic material layer, in which thicknesses of at least some regions of the second electrode are different from those of the other regions thereof.

A relatively thin region in the second electrode may serve as the above-described fuse layer.

A difference in thickness between the relatively thin region in the second electrode and the other regions may be from 10 nm to 100 nm. When the difference in thickness is less than 10 nm, electrical connection between the second electrode patterns may be unstable.

The second electrode may comprise one or more of Al, Ag, Ca, Mg, Au, Mo, Ir, Cr, Ti, Pd, an alloy thereof, and the like, but is not limited thereto.

Furthermore, an organic light emitting device according to still another exemplary embodiment of the present invention comprises: a substrate; a first electrode provided on the substrate; an organic material layer provided on the first electrode; a second electrode pattern provided on the organic material layer and comprising the compound represented by Formula 1; and a fuse layer provided in an entire region of an upper surface of the second electrode pattern and gaps between the second electrode patterns.

In the present invention, the compound of Formula 1 may be exemplified as compounds of the following Formulas 1-1 to 1-6, but is not limited thereto.

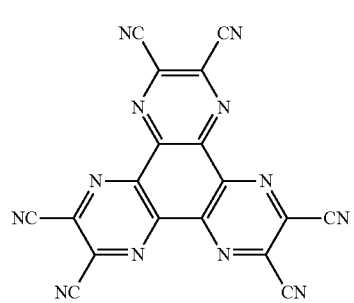

[Formula 1-1]

[Formula 1-2]

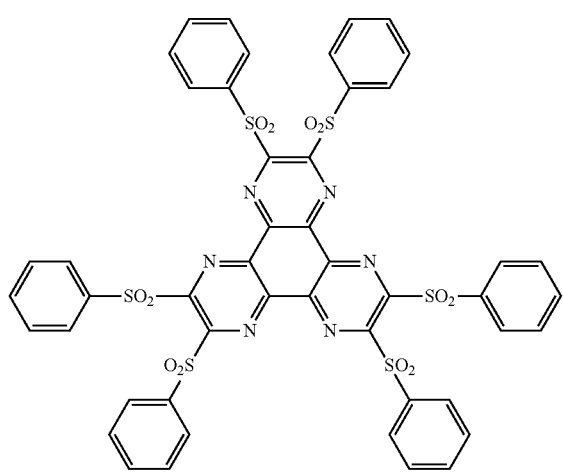

[Formula 1-3]

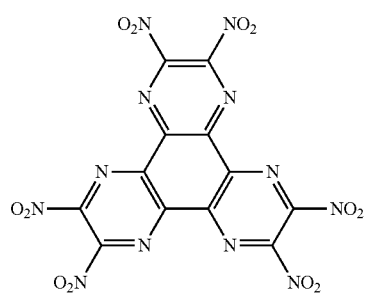

[Formula 1-4]

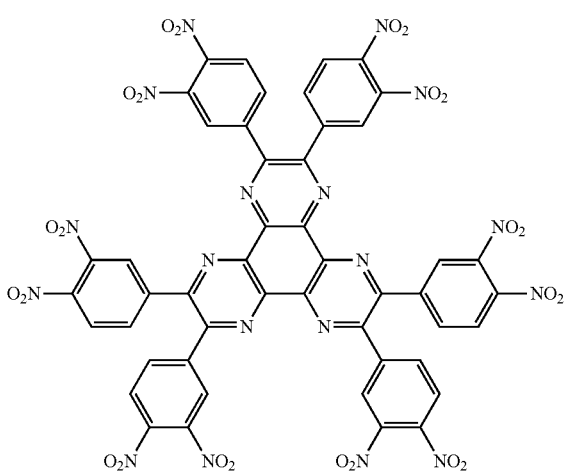

[Formula 1-5]

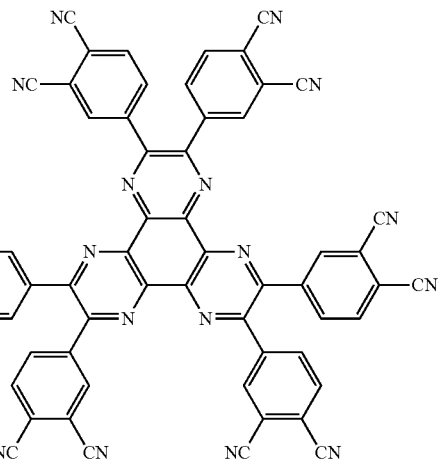

[Formula 1-6]

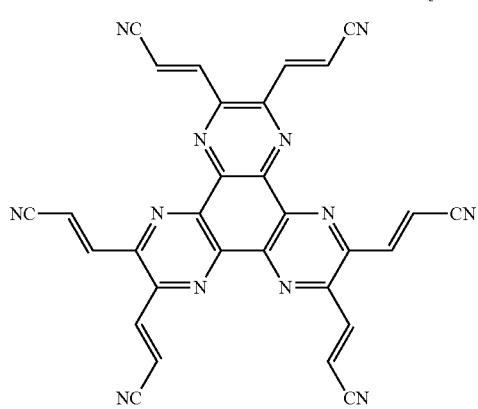

Other examples, or synthesis methods and various characteristics of Formula 1 are described in US Patent Application No. 2002-0158242, and U.S. Pat. Nos. 6,436,559 and 4,780,536, and the contents of these documents are all incorporated in the present specification.

In the organic light emitting device according to the present invention, those known in the art may be used as the substrate without limitation. More specifically, a hard substrate such as glass, $SiO_2$, and a silicon wafer, or a film substrate such as polyethylene terephthalate (PET), polycarbonate (PC), polyimide (PI), polyethylene naphthalate (PEN), and cycloolefin polymer (COP) may be used, but the substrate is not limited thereto.

In the organic light emitting device according to the present invention, the first electrode may be a transparent electrode.

More specifically, the first electrode may comprise a transparent conductive material such as indium tin oxide (ITO), IZO, ZnO, and $SnO_2$, but is not limited thereto.

The first electrode may be formed by depositing a metal, a metal oxide having conductivity, an alloy thereof, and the like on a substrate using a physical vapor deposition (PVD) method such as sputtering or e-beam evaporation.

In the organic light emitting device according to the present invention, an auxiliary electrode may be additionally comprised on the first electrode. The auxiliary electrode is for improving the resistance of the first electrode, and may be formed by depositing one or more selected from the group consisting of a conductive sealant and a metal. More specifically, the auxiliary electrode may comprise Cr, Mo, Al, Cu, an alloy thereof and the like, but is not limited thereto.

The organic light emitting device according to the present invention may be applied to an organic light emitting device for illumination, but is not limited thereto.

The organic light emitting device according to the present invention comprises the fuse layer on the second electrode such that when excessive current is generated at a specific organic light emitting unit, a portion, in which the second electrode and the fuse layer are in contact with each other, is automatically disconnected, thereby preventing the entire organic light emitting device from being electrically short-circuited.

Further, when excessive current is generated at a specific organic light emitting unit, and as a result, the entire organic light emitting device is electrically short-circuited, the second electrode, the fuse layer and the like may be formed again by using an additional deposition process, and thereby defects of the organic light emitting device may be more easily repaired.

In the organic light emitting element according to the present invention, the organic material layer may be produced with fewer layers by not only a deposition method using various polymer materials, but also a solvent process, for example, a method, such as spin coating, dip coating, doctor blading, screen printing, inkjet printing, or a thermal transfer method.

The organic material layer may have a stacked structure in which the organic material layer comprises a light emitting layer, and further comprises one or more selected from a hole injection layer, a hole transporting layer, an electron transporting layer, and an electron injection layer.

As a material capable of forming the hole injection layer, a material having a large work function is preferred such that the injection of holes into the organic material layer may be facilitated. Specific examples of the hole injection material which may be used in the present invention comprise: a metal, such as vanadium, chromium, copper, zinc, and gold, or an alloy thereof; a metal oxide, such as zinc oxide, indium oxide, indium tin oxide (ITO), and indium zinc oxide (IZO); a combination of metal and oxide, such as ZnO:Al or $SnO_2$:Sb; an electrically conductive polymer, such as poly (3-methylthiophene), poly[3,4-(ethylene-1,2-dioxy)thiophene] (PEDT), polypyrrole, and polyaniline, and the like, but the present invention is not limited thereto.

As a material capable of forming the electron injection layer, a material having a small work function is preferred such that electrons are usually easily injected into the organic material layer. Specific examples of the electron injection material comprise: a metal, such as magnesium, calcium, sodium, potassium, titanium, indium, yttrium, lithium, gadolinium, aluminum, silver, tin, and lead, or an alloy thereof; a multilayer-structured material, such as LiF/Al or $LiO_2$/Al, and the like, and it is possible to use the same material as the hole injection electrode material, but the present invention is not limited thereto.

As a material capable of forming the light emitting layer, a material is preferred which is capable of emitting light in a visible ray region by receiving and recombining holes from the hole transporting layer and electrons from the electron transporting layer, respectively, and has high quantum efficiency for fluorescence and phosphorescence. Specific examples thereof comprise: 8-hydroxy-quinoline aluminum complex ($Alq_3$); carbazole-based compounds; dimerized styryl compounds; BAlq; 10-hydroxybenzoquinoline-metal compounds; benzoxazole-based, benzthiazole-based, and benzimidazole-based compounds; poly(p-phenylenevinylene) (PPV)-based polymers; spiro compounds; polyfluorene and rubrene; phosphorescence host CBP [[4, 4'-bis(9-carbazolyl)biphenyl]; and the like, but are not limited thereto.

In addition, the light emitting material may additionally comprise a phosphorescent dopant or a fluorescent dopant in order to improve fluorescent or phosphorescent characteristics. Specific examples of the phosphorescent dopant comprise ir(ppy)(3) [fac tris(2-phenylpyridine) iridium], F2Irpic [iridium(III)bis(4,6,-di-fluorophenyl-pyridinato-N,C2)picolinate], and the like. As the fluorescent dopant, those known in the art may be used.

As a material capable of forming the electron transporting layer, a material is suitable which may receive electrons from the electron injection layer and transport the electrons to the light emitting layer well and has high mobility to electrons. Specific examples thereof comprise Al complexes of 8-hydroxyquinoline; complexes comprising $Alq_3$; organic radical compounds; hydroxyflavone-metal complexes; and the like, but are not limited thereto.

Furthermore, the organic material layer may have a form in which the organic material layer is doped with a metal, but is not limited thereto.

The organic light emitting device according to the present invention may additionally comprise an insulating layer pattern on the substrate. The insulating layer pattern may serve to distinguish pixels in the organic light emitting device having a large area, and may be formed using a material and a method which are known in the art.

Further, a specific example of a method for preparing the organic light emitting device according to an exemplary embodiment of the present invention comprises 1) forming a first electrode on a substrate, 2) forming an organic material layer on the first electrode, 3) forming two or more metal layers spaced apart from each other on the organic material layer, and 4) forming a fuse layer in an entire region of a top surface of the metal layer and gaps between the metal layers spaced apart from each other.

In the method for preparing the organic light emitting device according to the present invention, the fuse layer may comprise a metal having a melting point lower than that of the metal layer. More specifically, the fuse layer may comprise one or more of Al, Ca, Mg, Ag, indium (In), and the like, but is not limited thereto.

In addition, the metal layer and the fuse layer may comprise the same material.

Hereinafter, the present invention will be described in more detail through the drawings.

Figure 2:
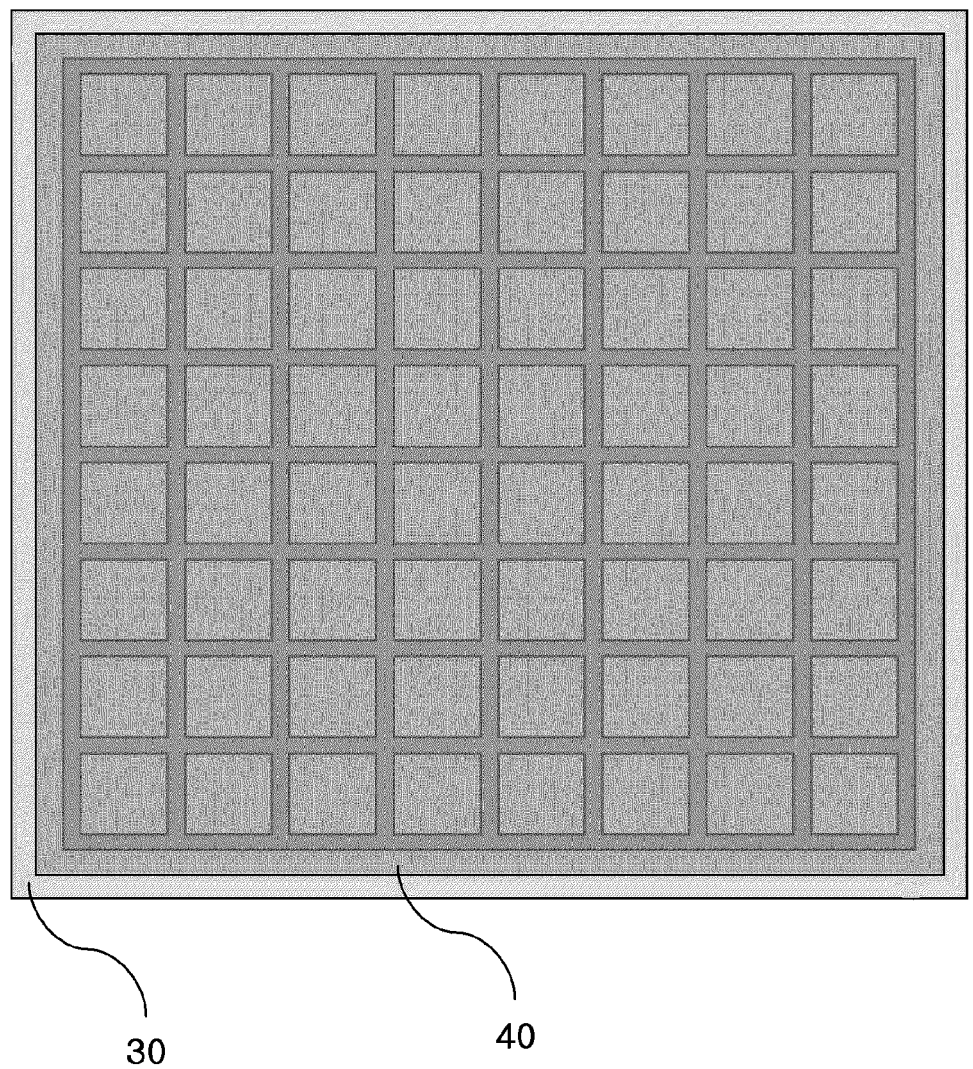
FIG. 2 is a plan view schematically illustrating the organic light emitting device comprising the fuse layer as an exemplary embodiment of the present invention.

The following FIGS. 1 and 2 illustrate an organic light emitting device according to an exemplary embodiment of the present invention, respectively.

More specifically, FIG. 1 is a vertical sectional view schematically illustrating an organic light emitting device comprising a first electrode 10, an organic material layer 20, a second electrode pattern 30, and a fuse layer 40.

FIG. 2 is a plan view schematically illustrating the organic light emitting device comprising the first electrode 10, the organic material layer 20, the second electrode pattern 30, and the fuse layer 40.

Figure 3:
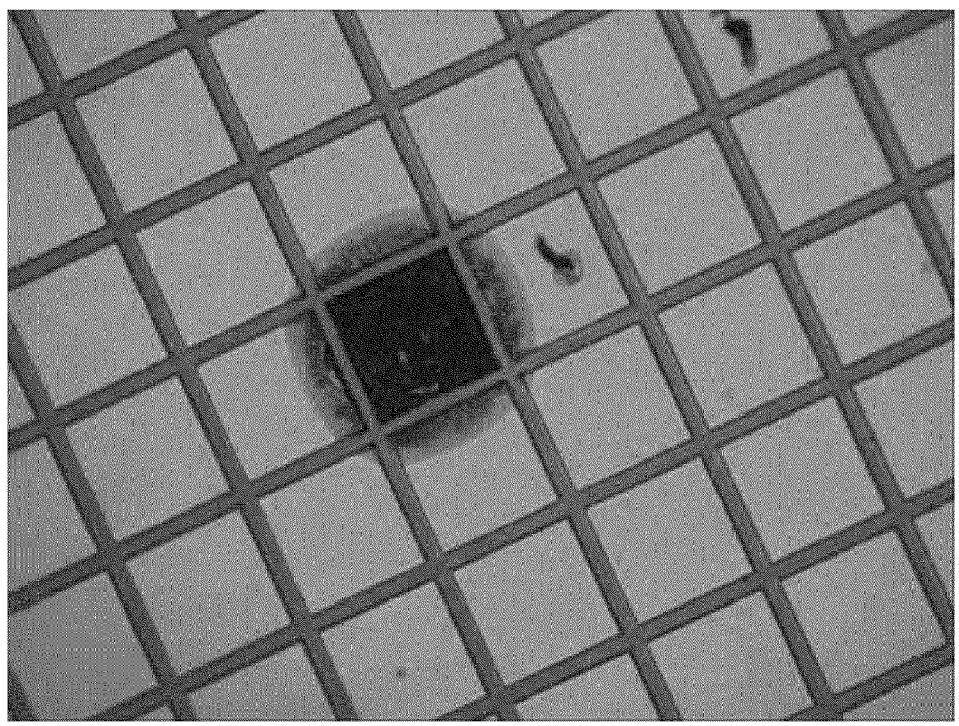
FIG. 3 is a view illustrating a shape that a part of the organic light emitting device is electrically short-circuited.

FIG. 3 is a view illustrating a shape that a part of the organic light emitting device is electrically short-circuited.

Even when a defect occurs in a part of the organic light emitting device having a large area as illustrated in FIG. 3, the entire organic light emitting device may not be used in the related art, but the present invention comprises a fuse layer on a second electrode so as to electrically short-circuit only a specific organic light emitting pixel when excessive current occurs, thereby preventing the entire organic light emitting device from being defective. Furthermore, the fuse layer and the like may be formed again using an additional deposition process in the organic light emitting pixels on which defects occur, and thereby defects of the organic light emitting device may be more easily repaired.

The organic light emitting device according to the present invention may comprise a light extraction structure.

In the present invention, the organic light emitting device may additionally comprise an internal light extraction layer between the substrate and the first electrode. Further, the organic light emitting device may additionally comprise an external light extraction layer on a surface opposite to a surface of the substrate on which the first electrode is provided.

In the present invention, the internal light extraction layer or the external light extraction layer is not particularly limited as long as the layer has a structure in which light scattering may be induced so as to improve the light extraction efficiency of the organic light emitting device. More specifically, the light extraction layer may have a structure in which scattering particles are dispersed in a binder.

In addition, the light extraction layer may be directly formed on a base material by a method such as spin coating, bar coating, slit coating, and the like, or may be formed by a method of manufacturing the layer in a film form and attaching the layer.

In the present invention, the organic light emitting device is a flexible organic light emitting device. In this case, the base material comprises a flexible material. For example, it is possible to use glass having a flexible thin film form, and a substrate having a plastic or film form.

A material of the plastic substrate is not particularly limited, but generally, a film of PET, PEN, PI, and the like may be used in the form of a single layer or plural layers.

Furthermore, the present invention provides a display apparatus comprising the organic light emitting device.

Further, the present invention provides an illumination apparatus comprising the organic light emitting device.

As described above, the organic light emitting device according to the present invention comprises a fuse layer on a second electrode such that when excessive current is generated at a specific organic light emitting unit, a portion, in which the second electrode and the fuse layer are in contact with each other, is automatically disconnected, thereby preventing the entire organic light emitting device from being electrically short-circuited.

The invention claimed is:

1. An organic light emitting device comprising:
a substrate;
a first electrode provided on the substrate;
an organic material layer provided on the first electrode;
a second electrode pattern provided on the organic material layer and comprising two or more metal layers spaced apart from each other; and
a fuse layer provided in an entire region of an upper surface of the second electrode pattern and gaps between the metal layers spaced apart from each other,
wherein a difference in thickness between the metal layer and the fuse layer is from 10 nm to 100 nm such that a portion, in which the second electrode pattern and the fuse layer are in contact with each other, is disconnected when an amount of current thereof exceeds a threshold value.

2. The organic light emitting device of claim 1, wherein the metal layer comprises one or more selected from the group consisting of Al, Ag, Ca, Mg, Au, Mo, Ir, Cr, Ti, Pd, and an alloy thereof.

3. The organic light emitting device of claim 1, wherein the fuse layer comprises a metal having a melting point lower than that of the metal layer.

4. The organic light emitting device of claim 1, wherein the metal layer and the fuse layer comprise the same material.

5. The organic light emitting device of claim 4, wherein a thickness of the fuse layer is smaller than that of the metal layer.

6. The organic light emitting device of claim 1, wherein the fuse layer comprises one or more selected from the group consisting of Al, Ag, Ca, Mg, and indium.

7. The organic light emitting device of claim 1, wherein the metal layer comprises Ag, and the fuse layer comprises Ca.

8. The organic light emitting device of claim 1, wherein at least a part of the fuse layer is in contact with the organic material layer.

9. The organic light emitting device of claim 1, wherein at least a part of the fuse layer comprises a structure having a form which is electrically short-circuited.

10. An organic light emitting device comprising:
a substrate;
a first electrode provided on the substrate;
an organic material layer provided on the first electrode; and
a second electrode provided on the organic material layer,
wherein thicknesses of at least some regions of the second electrode are different from those of the other regions thereof,
wherein, in the second electrode, a difference in thickness between a relatively thin region and the other regions is from 10 nm to 100 nm such that a portion, in which the second electrode pattern and the fuse layer are in contact with each other, is disconnected when an amount of current thereof exceeds a threshold value.

11. The organic light emitting device of claim 10, wherein the second electrode comprises one or more selected from the group consisting of Al, Ag, Ca, Mg, Au, Mo, Ir, Cr, Ti, Pd, and an alloy thereof.

12. An organic light emitting device comprising:
a substrate;
a first electrode provided on the substrate;
an organic material layer provided on the first electrode;
a second electrode pattern provided on the organic material layer and comprising a compound represented by the following Formula 1; and
a fuse layer provided in an entire region of an upper surface of the second electrode pattern and gaps between the second electrode patterns:

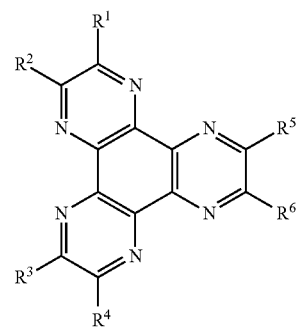

[Formula 1]

in Formula 1,
$R^1$ to $R^6$ are the same as or different from each other, and each independently hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), a substituted or unsubstituted straight or branched C$_1$ to C$_{12}$ alkoxy, a substituted or unsubstituted straight or branched C$_1$ to C$_{12}$ alkyl, a substituted or unsubstituted straight or branched C$_2$ to C$_{12}$ alkenyl substituted or unsubstituted aromatic or non-aromatic heterocyclic ring, a substituted or unsubstituted aryl, a substituted or unsubstituted mono- or di-aryl amine, or a substituted or unsubstituted aralkyl amine, in which R and R' are each independently a substituted or unsubstituted C$_1$ to C$_{60}$ alkyl, a substituted or unsubstituted aryl, or a substituted or unsubstituted 5- to 7-membered heterocyclic ring, wherein the fuse layer comprises a metal having a melting point lower than that of the second electrode pattern such that a portion, in which the second electrode pattern and the fuse layer are in contact with each other, is disconnected when an amount of current thereof exceeds a threshold value.

13. The organic light emitting device of claim 1, wherein the substrate is selected from the group consisting of glass, SiO$_2$, a silicon wafer, polyethylene terephthalate (PET), polycarbonate (PC), polyimide (PI), polyethylene naphthalate (PEN), and cycloolefin polymer (COP).

14. The organic light emitting device of claim 1, wherein the first electrode comprises one or more selected from the group consisting of indium tin oxide (ITO), IZO, ZnO, and SnO$_2$.

15. The organic light emitting device of claim 1, further comprising:
an internal light extraction layer provided between the substrate and the first electrode, or an external light extraction layer provided on a surface opposite to a surface of the substrate on which the first electrode is provided.

16. The organic light emitting device of claim 1, wherein the organic light emitting device is a flexible organic light emitting device.

17. A display apparatus comprising the organic light emitting device of claim 1.

18. An illumination apparatus comprising the organic light emitting device of claim 1.

19. A method for preparing an organic light emitting device, the method comprising:
1) forming a first electrode on a substrate;
2) forming an organic material layer on the first electrode;
3) forming two or more metal layers spaced apart from each other on the organic material layer; and
4) forming a fuse layer in an entire region of an upper surface of the metal layer and gaps between the metal layers spaced apart from each other,
wherein a difference in thickness between the metal layer and the fuse layer is from 10 nm to 100 nm such that a portion, in which the second electrode pattern and the fuse layer are in contact with each other, is disconnected when an amount of current thereof exceeds a threshold value.

20. The method of claim 19, wherein the fuse layer comprises a metal having a melting point lower than that of the metal layer.

21. The method of claim 19, wherein the metal layer and the fuse layer comprise the same material.

22. The method of claim 19, wherein the fuse layer comprises one or more selected from the group consisting of Al, Ag, Ca, Mg, and indium.

* * * * *